United States Patent
Lin et al.

(10) Patent No.: US 11,811,398 B2
(45) Date of Patent: Nov. 7, 2023

(54) CAPACITANCE SENSING DEVICE OPERATION METHOD

(71) Applicant: SENSORTEK TECHNOLOGY CORP., Jhubei (TW)

(72) Inventors: Wang-An Lin, Jhubei (TW); Chung-Jung Wu, Jhubei (TW); Chun-Lun Wang, Jhubei (TW)

(73) Assignee: Sensortek Technology Corp, Jhubei (TW)

( * ) Notice: Subject to any disclaimer, the term of this patent is extended or adjusted under 35 U.S.C. 154(b) by 0 days.

(21) Appl. No.: 17/220,288

(22) Filed: Apr. 1, 2021

(65) Prior Publication Data

US 2022/0057540 A1    Feb. 24, 2022

Related U.S. Application Data

(60) Provisional application No. 63/005,432, filed on Apr. 5, 2020.

(51) Int. Cl.
| | |
|---|---|
| *H03K 17/955* | (2006.01) |
| *H03K 17/96* | (2006.01) |
| *G01R 27/26* | (2006.01) |
| *G01V 3/08* | (2006.01) |
| *G06F 1/3231* | (2019.01) |
| *G06F 3/01* | (2006.01) |

(52) U.S. Cl.
CPC ....... *H03K 17/955* (2013.01); *G01R 27/2605* (2013.01); *G01V 3/088* (2013.01); *G06F 1/3231* (2013.01); *G06F 3/011* (2013.01); *H03K 17/962* (2013.01)

(58) Field of Classification Search
CPC ............. H03K 17/955; H03K 17/962; H03K 2217/94026; H03K 2217/94031; H03K 2217/960705; H03K 17/945; G01R 27/2605; G01V 3/088; G06F 1/3231; G06F 3/011
See application file for complete search history.

(56) References Cited

U.S. PATENT DOCUMENTS

| | | | |
|---|---|---|---|
| 8,736,577 B2 | 5/2014 | Land | |
| 2015/0268764 A1* | 9/2015 | Miyahara | G06F 3/0446 345/174 |
| 2020/0150819 A1* | 5/2020 | Haraikawa | G06F 3/0418 |

OTHER PUBLICATIONS

Communication From the Taiwan Patent Office Regarding a Corresponding Foreign Application dated (Taiwan Year 111) Feb. 23, 2022.

* cited by examiner

*Primary Examiner* — Amy He
(74) *Attorney, Agent, or Firm* — Rosenberg, Klein & Lee

(57) ABSTRACT

The present application relates to a method of operating a capacitance sensing device comprises: calculating a difference of a raw data compared to one of the raw data received in a previous data frame; and performing a comparison calculation based on the raw data and a stored baseline value to determine whether a proximity event has occurred. Under the proximity event, selects one of several baseline value update procedures based on the magnitude of the difference. Thus, the present application effectively avoids the problem of failure to update the baseline value when the object is close to the capacitance sensing device for a long period of time, which may lead to misjudgment of the capacitance sensing device.

13 Claims, 3 Drawing Sheets

CAPACITANCE SENSING DEVICE OPERATION METHOD

FIELD OF THE INVENTION

The present application refers to an operation method of a sensing device, in particular to an operation method for timely updating the baseline value of a capacitance sensing device.

BACKGROUND OF THE INVENTION

Many electronic devices in the market are equipped with proximity sensors. The proximity sensors are used to detect the approaching of objects to the electronic devices and have the electronic devices make corresponding judgment or control actions. The proximity sensors are usually made by light sensors, in which a light sensor operates by having light-emitting element emit light and measures the intensity of reflective light to detect if an object is approaching or not. Such light-emitting element can merely sense the object moving in the direction of light emitted by the light-emitting device, thus the applications are limited.

Instead, the proximity sensors also can be made by capacitance sensing devices. The application is based on using the capacitance that a sensing pad has sensed while an object is closing to the capacitance sensing device to detect if the object is in close proximity to the electronic device or not. This method not only can sense objects closing to the electronic device from all directions, due to the fact that the dielectric coefficient of human body is different from other materials, the proximity sensor made by the capacitance sensing device also can identify whether the object in close proximity to the electronic device is human body or not. If user is in close proximity to the electronic device, it will reduce the emitting power of radio frequency circuit in the electronic device and control the Specific Absorption Rate (SAR) be within the specification to protect human body health.

In general, the capacitance sensing device will make comparing operation on the capacitance sensed by the sensing pad and a baseline, and use it to detect if the proximity event occurs or not. Along with the change of environmental conditions such as the temperature and humidity, the capacitance sensed by the sensing pad will be different. Therefore, the baseline value should be dynamically adjusted along with the environmental condition to ensure the capacitance sensing device able to detect the proximity of object correctly. In the existing technology, the method of adjusting the baseline value utilizes the capacitance sensed by the sensing pad, while there is no proximity event, to update the baseline value. On the contrary, when the proximity event occurs, the existing technology will decide that the capacitance sensed by the sensing pad is mainly caused by the proximity of an object, therefore, it will entirely or partially freeze the updating of the baseline value when the proximity event occurs.

Yet, when an object is closing to the capacitance sensing device for a relative long period, the existing technology will be unable to update the baseline value in time and result in the possible misjudgment of the capacitance sensing device, making the device unable to escape from the proximity event correctly or detect the proximity event once again. For example, when user keeps talking with the electronic device close to his/her face, and the surrounding environment changes drastically (such as walking from a warm outdoor into an air-conditioning room), the existing technology will entirely or partially freeze the updating of the baseline value in the process, and thus it may lead to the subsequent misjudgment of the capacitance sensing device.

Based on the above issue, the present application provides an operation method that can timely update the baseline value of the capacitance sensing device, which can improve the matching level of the baseline value of the capacitance sensing device and the environmental conditions, and further increase the accuracy of the judgment on the proximity event.

SUMMARY

One purpose of the present application is to provide an operation method of the capacitance sensing device, which can use a plurality of proximity baseline updating procedures to continuously and consistently update the baseline value when the proximity event occurs, which can improve the matching level of the baseline value of the capacitance sensing device and the environmental conditions, and further increase the accuracy of the judgment on the proximity event.

The present application includes a capacitance sensing device operation method, which is implemented by means of a signal processing circuit, a baseline processing circuit and a proximity sensing circuit; the capacitance sensing device operation method includes: The signal processing circuit receives a detecting data; the baseline processing circuit calculates the difference between the detecting data and the detecting data received from the previous data frame; the proximity sensing circuit makes comparing operation on the detecting data and a preserved baseline value to detect if the proximity event occurs; when the proximity event occurs, the baseline processing circuit selects one baseline updating procedure from a plurality of proximity baseline updating procedures to update the baseline value based on the range in which the difference falls within; when the proximity event does not occur, the baseline processing circuit uses a non-proximity baseline value updating procedure to update the baseline value; and the baseline processing circuit outputs the updated baseline value to the proximity sensing circuit.

The present application includes another capacitance sensing device; the difference between it and the aforesaid operation method is that when the proximity event does not occur, the baseline processing circuit select a non-proximity baseline value updating procedure from several non-proximity baseline value updating procedures based on the range in which the difference falls within and use it to update the baseline value.

DETAILED DESCRIPTION

To enable the Review Committee members having deeper realization and understanding on the features and functions of the present application, we hereby put the embodiments and detailed explanation in below:

Some words in the Invention Description and the Claims are used to indicate the specific elements. However, persons with general knowledge in the technical field of the present application should understand that the manufacturer may use different names to refer to the same element. Moreover, the descriptions and Claims do not use the name difference as a way to distinguish components, but will take the differences in overall technology of components as the distinction criteria. "Including" mentioned in the entire Invention Description and the Claim items is an "open" term, it should be interpreted as "including but not limited to". Furthermore, the term "coupling" includes any direct and indirect means of connection. Therefore, if a first device is described to be coupled to a second device, it means that the first device can be directly connected to the second device or indirectly connected to the second device through other devices or other means of connection.

Figure 1:
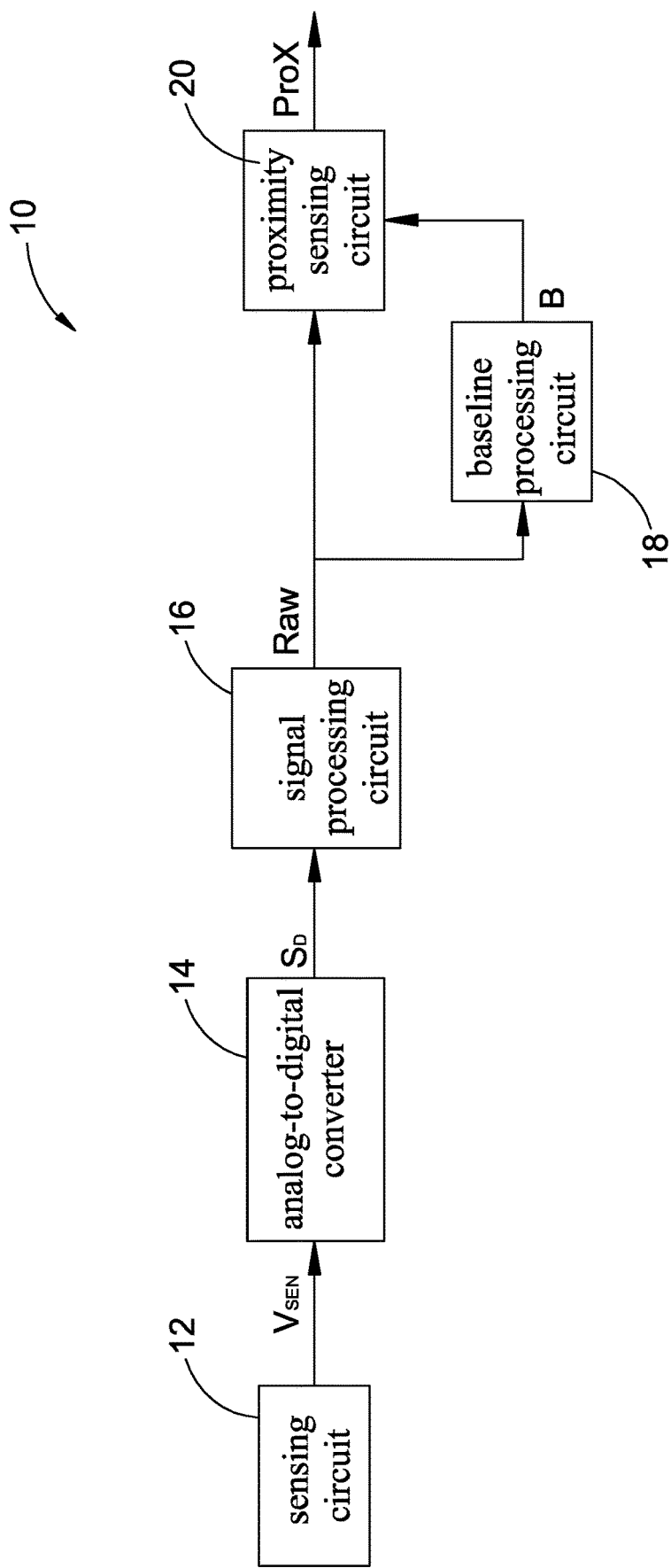
FIG. 1: The block diagram of the capacitance sensing device in an embodiment of the present application.

Due to the fact that the conventional capacity sensing devices will entirely or partially freeze the baseline value updating when the proximity event occurs, which may lead to the misjudgment of the conventional capacity sensing devices; the present application proposes a capacity sensing device operation method to solve this problem. The following description will further explain the characteristics of the capacitance sensing device operation method disclosed by the present application and the configuration of the capacitance sensing device it is using:

First, referring to FIG. 1, which is the block diagram of the capacitance sensing device in an embodiment of the present application. As shown in FIG. 1, the capacitance sensing device 10 includes a sensing circuit 12, an analog-to-digital converter 14, a signal processing circuit 16, a baseline processing circuit 18 and a proximity sensing circuit 20. The sensing circuit 12 is equipped with a sensing pad, which can be equivalent to a capacitor. The equivalent capacitance of the sensing pad varies when the object is in close proximity to the sensing pad, the said object can be human body, table or touch pen, etc. The equivalent capacitance of the sensing pad is used to sense whether or not the object is in close proximity to the capacitance sensing device. The sensing circuit 12 can input signal to the sensing pad and generates the corresponding sensing signal $V_{SEN}$ against the equivalent capacitance of the sensing pad.

The analog-to-digital converter 14 which is coupled to the sensing circuit 12 has received the analog sensing signal $V_{SEN}$ and converts it into a digital signal $S_D$ and outputs $S_D$. The signal processing circuit 16 is coupled to the analog-to-digital converter 14 to receive the digital signal $S_D$. The signal processing circuit 16 generate a detecting data Raw based on the digital signal $S_D$. Detailed speaking, the detecting data Raw can be the digital signal $S_D$ or its adjusted value, such as the mean or weighted mean value of the digital signal $S_D$ from a few sensing data frames and the present application is not limited to that.

The baseline processing circuit 18 is coupled to the signal processing circuit 16 to receive the detecting data Raw and adjust a baseline B. The proximity sensing circuit 20 is coupled to the signal processing circuit 16 and the baseline processing circuit 18 to respectively receive the detecting data Raw and the baseline value B, and follows the comparison operating result of the detecting data Raw and the baseline value B to detect if there is an object that is in close proximity to the capacitance sensing device; it can generate a proximity signal ProX to express there is a proximity event.

Figure 2:
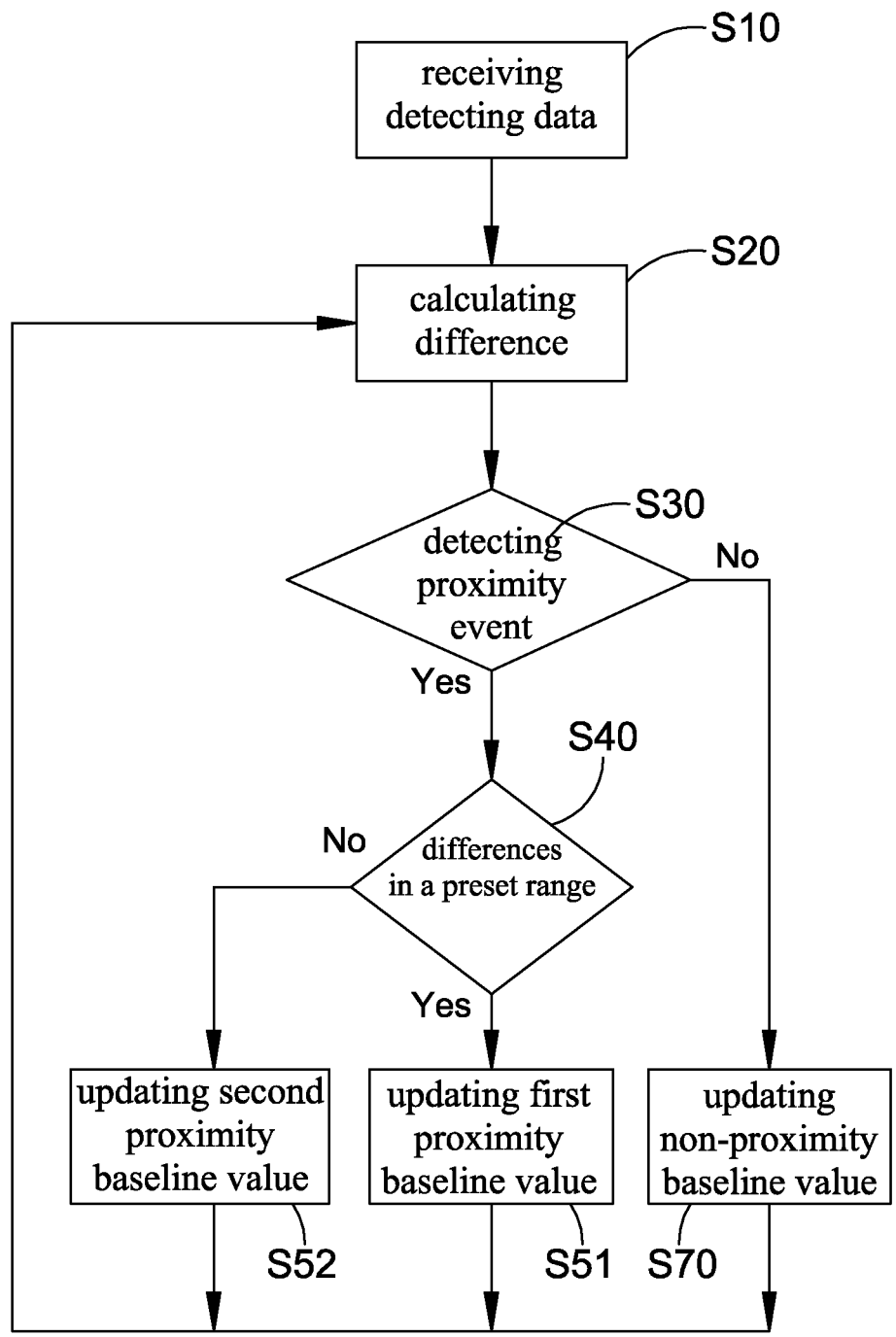
FIG. 2: The operating flowchart in an embodiment of the present application.

Referring to FIG. 2, after the capacitance sensing device 10 in the operation method of the capacitance sensing device shown in an embodiment of the present application has worked, we describe the operating flow contained in the operation method of the capacitance sensing device in an embodiment of the present application as follows:

First, the baseline processing circuit 18 and the proximity sensing circuit 20 receive the detecting data Raw[n] (S10).

The baseline processing circuit 18 is the difference of the detecting data Raw[n] (S20), which is equal to the value that the newly obtained detecting data Raw[n] subtracts the detecting data Raw[n−1] received from the last data frame; and it obtains a difference value Diff[n] as shown in below:

$$\mathrm{Diff}[n]=\mathrm{Raw}[n]-\mathrm{Raw}[n-1]$$

Now the baseline processing circuit 18 hasn't updated the baseline value B yet, the baseline value kept in the proximity sensing circuit 20 is the baseline value B[n−1] provided by the baseline processing circuit 18 in last data frame. The proximity sensing circuit 20 follows the comparison operating result of the detecting data Raw[n] and the baseline value B[n−1] to detect if there is an object that is in close proximity to the capacitance sensing device (S30) or not. For example, in general, the proximity sensing circuit 20 will preset a threshold THD, once the difference between the detecting data Raw[n] and the baseline value B[n−1] is larger than the threshold THD (that is, Raw[n]−B[n−1] >THD), it can decide that there is an object that is in close proximity to the capacitance sensing device, the proximity sensing circuit 20 then outputs a first level (for example, the high level) proximity signal ProX to show that the proximity event has occurred; on the contrary, if the difference between the detecting data Raw[n] and the baseline value B[n−1] doesn't exceed the threshold THD (that is, Raw[n]−B[n−1] ≤THD), it decides that there is no object that is in close proximity to the capacitance sensing device, the proximity sensing circuit 20 thus outputs a second level (for example, the low level) proximity signal ProX to show that the proximity event hasn't occurred.

The operations of the aforesaid baseline processing circuit 18 and the proximity sensing circuit 20 can be made simultaneously or sequentially, the operating order isn't limited. Besides, the proximity sensing circuit 20 can output the proximity signal ProX to the baseline processing circuit 18, making the baseline processing circuit 18 detect if there is a proximity event or not. Yet, the baseline processing circuit 18 also can be received by the electronic device of the capacitance sensing device 10 directly to identify if the proximity event occurs or not and the present application isn't merely limited to that.

Next, when the proximity event occurs, based on the range in which the difference Diff[n] made by the aforesaid operation falls within, the baseline processing circuit 18 selects one baseline updating procedure from a plurality of proximity baseline updating procedures to update the baseline value B[n−1] (S40). Detailed speaking, this embodiment includes a first proximity baseline value updating S51 and a second proximity baseline value updating S52, the baseline processing circuit 18 is set with a preset range [THp(+), THp(−)], the upper threshold THp(+) is larger than the lower threshold THp(−); normally the upper threshold THp(+) is positive and the lower threshold THp(−) is negative; the upper and lower thresholds can be adjusted per the experimental statistics according to actual requirement. The baseline processing circuit 18 determines whether to use the first proximity baseline value updating S51 or the second proximity baseline value updating S52 to update the baseline value B [n−1] according to whether the difference Diff[n]

falls within the preset range [THp(+), THp(−)] or not. As a result, the baseline value B [n−1] can be updated.

If the difference Diff[n] is within the preset range [THp(+), THp(−)] (that is, THp(−)≤Diff[n]≤THp(+)), the baseline processing circuit 18 uses the first proximity baseline value updating S51 to update baseline B[n−1], the example of the first proximity baseline value updating S51 can be expressed as follows:

$$B[n]=B[n-1]+\beta \times \text{Diff}[n]$$

Since now the difference Diff[n] is within the preset range, the change of the detecting data can be regarded as mainly caused by environmental conditions, the coefficient β should be set to be larger, and in some embodiments, it can be close to 1.

On the contrary, if the difference Diff[n] exceeds the preset range [THp(+), THp(−)] (that is, THp(−)>Diff[n], or Diff[n]>THp(+)), the baseline processing circuit 18 uses the second proximity baseline value updating S52 to update the baseline value B[n−1]. An example of the second proximity baseline value updating S52 can be expressed as follows:

$$B[n]=Gp \times \text{Raw}[n]+(1-Gp) \times \text{Diff}[n]$$

Since the difference Diff[n] has exceeded the preset range, the change of the detecting data can be regarded as caused by the environmental conditions and the proximity of the object. By controlling the size of an adjustment coefficient Gp, it can control the influencing magnitude of the detecting data Raw[n] on the updated baseline B[n]. By considering the aforesaid records, anyone in this field with ordinary knowledge can know that in some embodiments of the present application, when the difference Diff[n] is less than the lower threshold THp(−), the second proximity baseline value updating S52 can update the baseline value B[n−1]; and when the difference Diff[n] is larger than the upper threshold THp(+), it uses a third proximity baseline updating to update the baseline value B[n−1]. Therefore, in the present application, the baseline processing circuit follows the fallen range of the difference generated from the aforesaid operation to select a procedure from a plurality of proximity baseline updating procedures and update the baseline value when a proximity event occurs, which is not limited to the first proximity baseline value updating S51 and the second proximity baseline value updating S52 listed in this embodiment.

On the other hand, when the proximity event does not occur, the baseline processing circuit 18 updates the baseline value B[n−1] according to a non-proximity baseline value updating S70. The non-proximity baseline value updating S70 can be as shown in the following equation for example:

$$B[n]=Gn \times \text{Raw}[n]+(1-Gn) \times \text{Diff}[n]$$

Now there is no proximity event; although the change of detecting data can be regarded as mainly caused by environmental conditions, yet, there may be noises caused by many reasons in the environment, which may be different from the environmental conditions such as temperature or humidity that causes continuous and consistent influence to the detecting data Raw[n]; therefore, by controlling the size of an adjustment coefficient Gn, it still can control the influencing magnitude of the detecting data Raw[n] on the updated baseline B[n]. The adjustment coefficient Gn can preferably be designed between ½ and ½₅₆, and Gn is preferably greater than the adjustment coefficient Gp of the second proximity baseline value updating S52 mentioned above.

After the baseline processing circuit 18 has completed the aforesaid first proximity baseline value updating S51, second proximity baseline value updating S52 or non-proximity baseline value updating S70, it outputs the updated baseline B[n] to the proximity sensing circuit 20 for the proximity sensing circuit 20 to judges whether or not there is an object in close proximity to the capacitance sensing device in the next data frame.

In summary, by the operation method of the capacity sensing device stated in the aforesaid embodiment of the present application, it can select a baseline updating procedure from several baseline updating procedures to update the baseline value according to the range that the difference of the detecting data falls within when the proximity event occurs. From this, the capacitance sensing device operation method of the present application does not need to freeze the updating of the baseline value, which can effectively avoid the problem that the baseline value cannot be updated in time when the object is in close proximity to the capacitance sensing device for a long time, which would lead to the possibility of misjudging the capacitance sensing device.

When the difference of the detecting data is small, the difference in the detecting data can be regarded as mainly caused by the environmental conditions; and a higher weight can be used to update the baseline value with the detecting data, as described in the example of the first proximity baseline value updating S51 mentioned above. On the contrary, when the difference of the detecting data is large, the difference in the detecting data can be regarded as caused by both the environmental conditions and the proximity of the object, so a lower weight can be used to update the baseline value with the detecting data, as described in the example of the second proximity baseline value updating S52 mentioned above. In this way, the capacitance sensing device operation method of the present application's embodiment can take the characteristics of timely updating the baseline value into account, and it won't excessively incorporate the detection data changes caused by the proximity of object into the updated baseline; therefore, it can effectively improve the matching level of the baseline value of the capacitance sensing device and the environmental conditions, and further increase the accuracy of the judgment on the proximity event.

Figure 3:
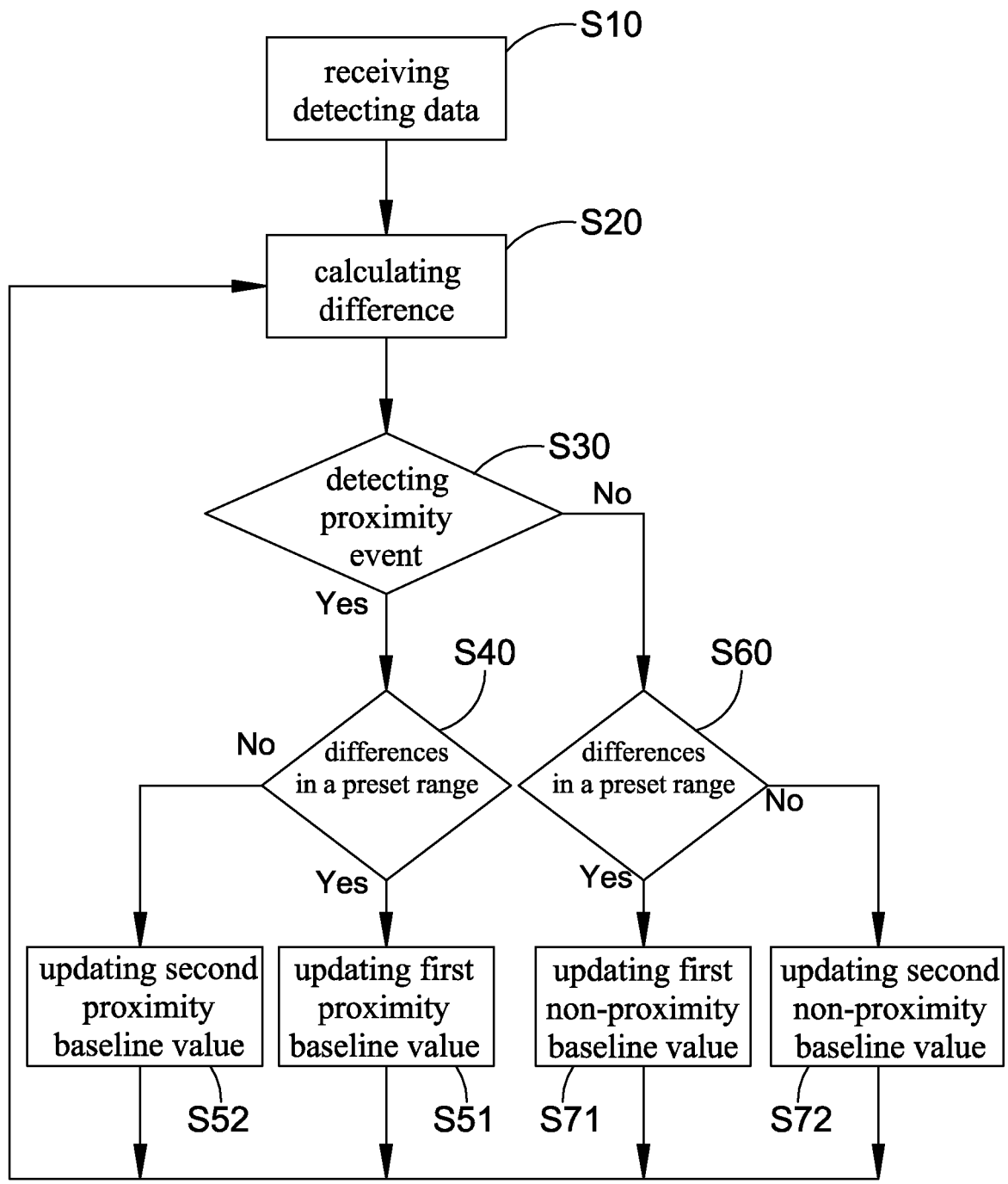
FIG. 3: The operating flowchart in another embodiment of the present application

Referring to FIG. 3, which is the operating flowchart of capacitance sensing device operation method in another embodiment of the present application. The difference from the previous embodiment is that: When the proximity event does not occur, the baseline processing circuit 18 still selects a baseline updating procedure from two or more non-proximity baseline value updating procedures according to the range of the difference Diff[n] generated by the previous operation to update the baseline value B[n−1] (S60). Detailed speaking, this embodiment includes a first non-proximity baseline value updating S71 and a second non-proximity baseline value updating S72. The baseline processing circuit 18 has a preset range [THn(+), THn(−)], in which the upper threshold THp(+) is larger than the lower threshold THp(−). Normally the upper threshold THp(+) is positive and the lower threshold THp(−) is negative; the upper and lower thresholds can be adjusted per the experimental statistics according to actual requirement. The baseline processing circuit 18 judges to use the first non-proximity baseline value updating S71 or the second non-proximity baseline value updating S72 according to whether the difference Diff[n] falls within the preset range [THn(+), THn(−)] or not, and updates the baseline value B[n−1].

If the difference Diff[n] falls within the preset range [THn(+), THn(−)] (that is, THn(−)≤Diff[n]≤THn(+)), then, the baseline processing circuit 18 updates baseline B[n−1] by means of the first non-proximity baseline value updating S71. For example, the first non-proximity baseline value updating S71 can be similar to the aforesaid non-proximity baseline value updating S70, as shown in below:

$$B[n]=Gn\times \text{Raw}[n]+(1-Gn)\times \text{Diff}[n]$$

The adjustment coefficient Gn can also preferably be designed between ½ and 1/256. By controlling the size of the adjustment coefficient Gn, the unnecessary noises in the environment can be appropriately filtered out.

On the contrary, if the difference Diff[n] exceeds the preset range [THn(+), THn(−)] (that is, THn(−)>Diff[n]; or Diff[n]>THn(+)), The baseline processing circuit 18 makes updating by means of the second non-proximity baseline value updating S72. For example, the second non-proximity baseline value updating S72 can be shown as follows:

$$B[n]=B[n-1]+\alpha \times \text{Diff}[n]$$

Since now the difference Diff[n] has exceeded the preset range, although the proximity sensing circuit 20 judges that no proximity event has occurred, the excessively large difference in the detection data can be regarded as not mainly caused by the environmental conditions, therefore, the coefficient "[[a]]" "α" can be close to 0. By considering the aforesaid records, anyone in this field with ordinary knowledge can know that in some embodiments of the present application, when the difference Diff[n] is less than the lower threshold THn(−), the second non-proximity baseline value updating S72 can update the baseline value B [n−1]; and when the difference Diff[n] is larger than the upper threshold THn(+), it uses a third non-proximity baseline value updating to update the baseline value B [n−1]. Therefore, in the present application, the baseline processing circuit follows the fallen range of the difference generated from the aforesaid operation, selects a procedure from a plurality of proximity baseline updating procedures to update the baseline value when a proximity event does not occur, which is not limited to the first non-proximity baseline value updating S71 and the second non-proximity baseline value updating S72 listed in this embodiment.

It should be noted that in the first proximity baseline value updating S51 and the first non-proximity baseline value updating S71, the differences in detecting data are considered to be mainly caused by environmental conditions, therefore, the first proximity baseline value updating S51 method in the above example can also be applied to the first non-proximity baseline value updating S71; in the same way, the first non-proximity baseline value updating S71 in the above example can also be applied to the first proximity baseline value updating S51. On the other hand, in the second proximity baseline value updating S52 and the second non-proximity baseline value updating S72, the differences of detecting data are regarded as not being caused solely by environmental conditions, therefore, the second proximity baseline value updating S52 method in the above example can also be applied to the second non-proximity baseline value updating S72; in the same way, the second non-proximity baseline value updating S72 in the above example can also be applied to the second proximity baseline value updating S52. In addition, although the filtering operations listed in the previous embodiments of the present application belong to the infinite impulse response filter (IIR), yet, other failures of the present application can also be replaced by finite impulse response filters (FIR) operation or other noise reduction algorithms used to lower noise, depending on the application scenario.

Compared with the existing capacity sensing devices that entirely or partially freeze the updating of the baseline value when the proximity event occurs, which may lead to misjudgment of the conventional capacity sensing devices; the present application provides an operation method that can timely update the baseline value of capacity sensing device. Several types of proximity baseline updating procedures can be used to continuously update the baseline value when a proximity event occurs, which can effectively improve the matching level of the baseline value of the capacitance sensing device and the environmental conditions, and further increase the accuracy of the judgment on the proximity event. Therefore, the present application is innovative, progressive and available for industrial use. It should undoubtedly meet the patent application requirements of ROC Patent Act. We hereby file the patent application in the present application in accordance with the law and anticipate the Authority's patent granting.

However, the above are only preferred embodiments of the present application, and are not used to limit the scope of implementation of the present application. For example, all shapes, structures, features and spirits described in the scope of the patent application of the present application are equal changes and modifications shall be included in the scope of the patent application of the present application.

The invention claimed is:

1. A capacitance sensing device operation method, which is implemented by a signal processing circuit, a baseline processing circuit and a proximity sensing circuit; the capacitance sensing device operation method includes:
    the signal processing circuit receiving a detecting data;
    the baseline processing circuit calculating the difference between the detecting data and the detecting data received from the previous data frame;
    the proximity sensing circuit implementing a comparing operation on the detecting data and a preserved baseline value to judge if a proximity event occurs or not;
    wherein when the proximity event is occurred, the baseline processing circuit selects one of a plurality of proximity baseline updating procedures to update the baseline value based on the range in which the difference falls within;
    when the proximity event is not occurred, the baseline processing circuit uses a non-proximity baseline value updating procedure to update the baseline value; and
    the baseline processing circuit outputs the updated baseline value to the proximity sensing circuit.

2. The capacitance sensing device operation method of claim 1, in which the proximity baseline updating procedure includes the updating of a first proximity baseline value and the updating of a second proximity baseline value; set range; if the difference falls within the preset range, the baseline processing circuit uses the first proximity baseline value to update the baseline value; if the difference falls beyond the preset range, the baseline processing circuit uses the second proximity baseline value to update the baseline value.

3. The capacitance sensing device operation method of claim 2, in which the updating of the first proximity baseline value is shown as follows:

$$B[n]=B[n-1]+\beta \times \text{Diff}[n]$$

Where B[n] is the updated baseline, B[n−1] is the baseline value preserved by the proximity sensing circuit, Diff [n] is the difference and β is a coefficient.

4. The capacitance sensing device operation method of claim 2, in which the updating of the second proximity baseline value is shown as follows:

$$B[n]=Gp\times Raw[n]+(1-Gp)\times Diff[n]$$

Where B[n] is the updated baseline, Raw[n] is the detecting data, Diff[n] is the difference and Gp is an adjusting coefficient.

5. The capacitance sensing device operation method of claim 4, in which the updating of the non-proximity baseline value updating procedure is shown as follows:

$$B[n]=Gn\times Raw[n]+(1-Gn)\times Diff[n]$$

Where Gn is another adjusting coefficient, which is larger than the aforesaid adjusting coefficient Gp for the updating of the second proximity baseline value.

6. The capacitance sensing device operation method of claim 5, in which another adjusting coefficient Gn is designed in a value within $\frac{1}{2}\sim\frac{1}{256}$.

7. A capacitance sensing device operation method, which is implemented by a signal processing circuit, a baseline processing circuit and a proximity sensing circuit; the capacitance sensing device operation method includes:

the signal processing circuit receiving a detecting data;

the baseline processing circuit calculating difference between the detecting data and the detecting data received from the previous data frame;

the proximity sensing circuit implementing a comparing operation on the detecting data and a preserved baseline value to judge if the proximity event occurs;

wherein when the proximity event is occurred, the baseline processing circuit selects one of a plurality of proximity baseline updating procedures to update the baseline value based on the range in which the difference falls within;

when the proximity event is not occurred, the baseline processing circuit selects one of several non-proximity baseline value updating procedures to update the baseline value based on the range in which the difference falls within; and the baseline processing circuit outputs the updated baseline to the proximity sensing circuit.

8. The capacitance sensing device operation method stated in claim 7, in which the proximity baseline updating procedure includes a first proximity baseline value updating and a second proximity baseline value updating; the baseline processing circuit has a preset range, if the difference falls within the preset range, the baseline processing circuit uses the updating of the first proximity baseline value to update the baseline value; if the difference falls beyond the preset range, the baseline processing circuit uses the updating of the second proximity baseline value to update the baseline value, the non-proximity baseline value updating procedure includes a first non-proximity baseline value updating and a second non-proximity baseline value updating;

the baseline processing circuit has another preset range, if the difference falls within another preset range, the baseline processing circuit uses the updating of the first non-proximity baseline value to update the baseline value; if the difference falls beyond another preset range, the baseline processing circuit uses the updating of the second non-proximity baseline value to update the baseline value.

9. The capacitance sensing device operation method stated in claim 8, in which the first proximity baseline value updating is shown as follows:

$$B[n]=B[n-1]+\beta\times Diff[n]$$

Where B [n] is the updated baseline, B [n−1] is the baseline value preserved by the proximity sensing circuit, Diff[n] is the difference and β is a coefficient.

10. The capacitance sensing device operation method stated in claim 8, in which the second proximity baseline value updating is shown as follows:

$$B[n]=Gp\times Raw[n]+(1-Gp)\times Diff[n]$$

Where B[n] is the updated baseline, Raw[n] is the detecting data, Diff[n] is the difference and Gp is an adjusting coefficient.

11. The capacitance sensing device operation method stated in claim 10, in which the first non-proximity baseline value updating procedure is shown as follows:

$$B[n]=Gn\times Raw[n]+(1-Gn)\times Diff[n]$$

Where Gn is another adjusting coefficient, which is larger than the aforesaid adjusting coefficient Gp for the updating of the second proximity baseline value.

12. The capacitance sensing device operation method stated in claim 11, in which another adjusting coefficient Gn is designed in a value within $\frac{1}{2}\sim\frac{1}{256}$.

13. The capacitance sensing device operation method stated in claim 8, in which the first proximity second non-proximity baseline value updating procedure is shown as follows:

$$B[n]=B[n-1]+\alpha\times Diff[n]$$

Where B [n] is the updated baseline, B [n−1] is the baseline value preserved by the proximity sensing circuit, Diff[n] is the difference and α is a coefficient.

* * * * *